United States Patent [19]
Sibigtroth et al.

[11] Patent Number: 4,584,698
[45] Date of Patent: Apr. 22, 1986

[54] SHARABLE PRESCALED TIMER AND METHOD FOR A DATA PROCESSOR

[75] Inventors: James M. Sibigtroth; David Rivera, both of Austin, Tex.

[73] Assignee: Motorola, Inc., Schaumburg, Ill.

[21] Appl. No.: 548,177

[22] Filed: Nov. 2, 1983

[51] Int. Cl.$^4$ ...................... H03K 21/38; H03K 23/66
[52] U.S. Cl. ..................................... 377/110; 307/271
[58] Field of Search ................. 377/107, 110; 307/271

[56] References Cited

U.S. PATENT DOCUMENTS

| | | | |
|---|---|---|---|
| 3,036,223 | 5/1962 | Phillips | 377/110 |
| 3,263,174 | 7/1966 | Bjorkman et al. | 377/110 |
| 3,393,366 | 7/1968 | Shoop | 377/107 |
| 3,657,658 | 4/1972 | Kubo | 377/110 |

Primary Examiner—John S. Heyman
Attorney, Agent, or Firm—Anthony J. Sarli, Jr.; Jeffrey Van Myers

[57] ABSTRACT

A data processor having an integral timer including a clock generator producing a specific frequency output comprises a counter chain having an input and output thereof for supplying a fixed frequency divide function. A programmable prescaler couples the clock generator output to the counter chain input for providing a predetermined divisor input to the counter chain. A postscaler operates in consonance with the programmable prescaler coupled to the counter chain output for providing a timer output compensated for the predetermined divisor input. In operation, the timer output has a frequency bearing a constant relationship to the clock generator output frequency independent of the predetermined divisor input of the programmable prescaler.

11 Claims, 2 Drawing Figures

4,584,698

SHARABLE PRESCALED TIMER AND METHOD FOR A DATA PROCESSOR

BACKGROUND OF THE INVENTION

The present invention relates, in general, to the field of data processor timers and methods. More particularly, the present invention relates to a sharable prescaled timer and method for a microprocessor or microcomputer having a free running counter.

Current generation microprocessors (MPU's) and microcomputers (MCU's) have greatly increased bus speeds over their predecessors of just a short time ago. These very high operating speeds require a high frequency oscillator and clock generator for generating the central processing unit (CPU) cycle clock (E clock). This E clock will then be used to drive a free-running counter timer. Typically however, these MPU/MCU's will have interrelated subsystems and timing functions with independent and slower timing constraints which require, therefore, lower clocking frequencies.

Latest generation MPU/MCU's, may also incorporate a prescaler or multistage divider between the system E clock and free-running counter chain. This, in turn, has necessitated the replication of timer chains for each of the slower operating interrelated subsystems and timing functions (e.g. real time interrupt, watchdog timer, etc.) which must remain independent of the prescale factor utilized. Unfortunately, such additional timer chains utilizing cascade connected flip flops, each of which require a considerable amount of on-chip area, mean that such replicated timer chains are provided only at great expense in silicon area and concomitant cost.

SUMMARY OF THE INVENTION

It is therefore an object of the present invention to provide an improved sharable prescaled timer and method for a data processor.

It is still further an object of the present invention to provide an improved sharable prescaled timer and method for a data processor which allows for utilization of a common free-running counter chain by subsystems which must operate at a frequency independent of the prescaled frequency.

It is still further an object of the present invention to provide an improved sharable prescaled timer and method for a data processor which minimizes silicon area necessary to provide a data processor's timing functions by reducing the logic required to implement the combined functions.

The foregoing and other objects are achieved in the present invention wherein there is provided a data processor having an integral timer including a clock generator producing a specific frequency output which comprises a counter chain having an input and output thereof for supplying a fixed frequency divide function. A programmable prescaler couples the clock generator output to the counter chain input for providing a predetermined divisor input to the counter chain. A postscaler operating in consonance with the programmable prescaler and coupled to the counter chain output provides a timer output compensated for the predetermined divisor input. In operation, the timer output has a frequency bearing a constant relationship to the clock generator output frequency and is independent of the programmable prescaler's predetermined divisor input.

BRIEF DESCRIPTION OF THE DRAWINGS

The above-mentioned and other features and objects of the present invention and the manner of attaining them will become more apparent and the invention itself will be best understood by reference to the following description of an embodiment of the invention taken in conjunction with the accompanying drawings, wherein.

DESCRIPTION OF A PREFERRED EMBODIMENT

Figure 1A:
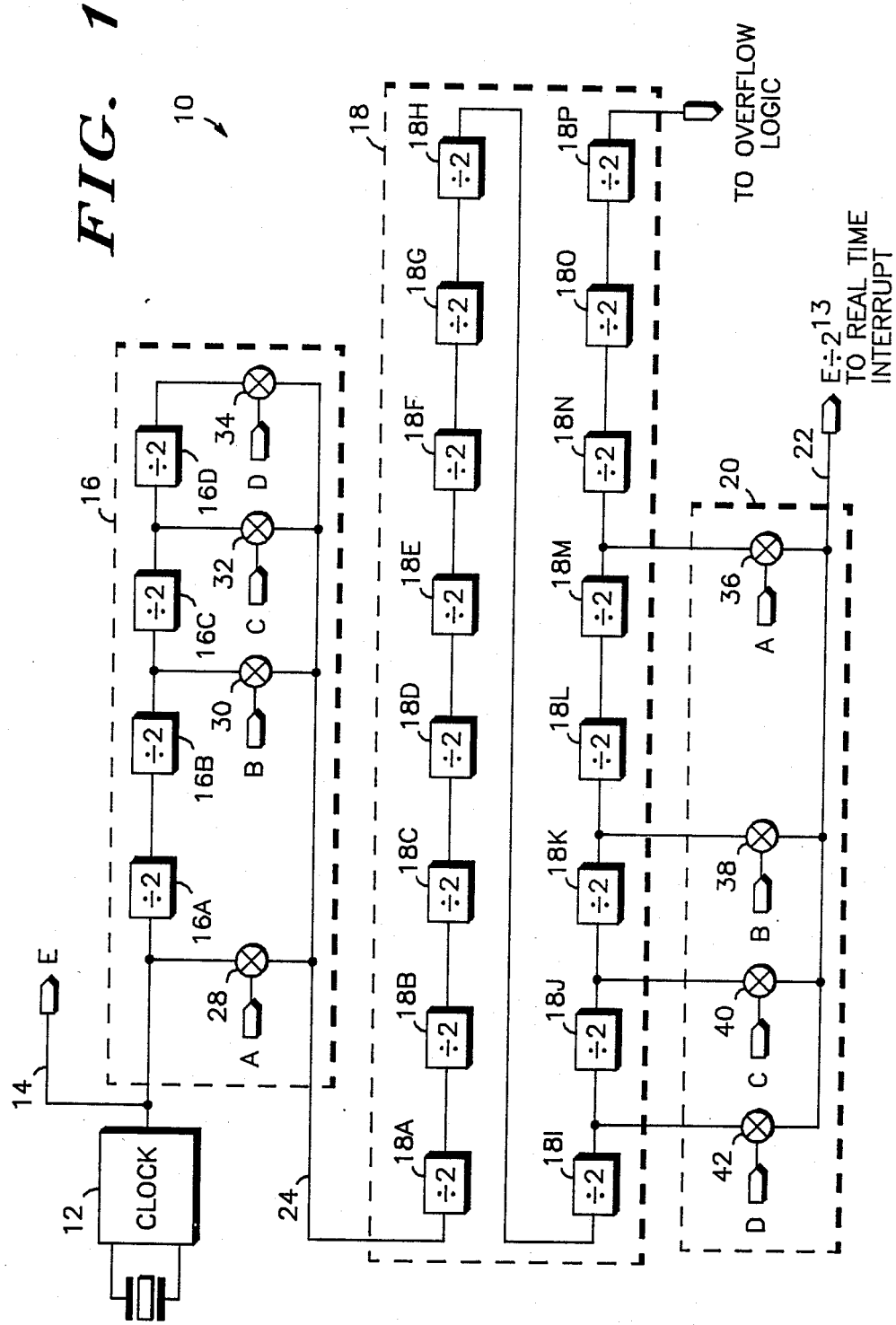
FIG. 1A is a simplified logic flow diagram of a sharable prescaled timer in accordance with the present invention illustrating the counter chain, programmable prescaler and postscaler thereof for providing a clocking signal to a real time interrupt function independent of the prescaler's programmably predetermined divisor.

With reference to FIG. 1A, a timer 10 in accordance with the present invention is shown. Timer 10 comprises, in pertinent part, a clock generator 12 for providing a high frequency output on E clock line 14. The high frequency clocking signal appearing on E clock line 14 is input to a prescaler 16. Prescaler 16 comprises a number of divider stages 16A, 16B, 16C and 16D which may comprise conventional flip flops, as well as transmission gates 28, 30, 32 and 34 which allow for the clocking signal on E clock line 14, or any of various prescaled clocking signals from prescaler 16, to be applied to counter chain input line 24. Specifically, when transmission gate 28 is enabled the output of clock generator 12 on E clock line 14 is applied directly to counter chain input line 24 such that the frequency input to counter chain 18 is E. When transmission gate 30 is enabled, divider stages 16A and 16B are inserted between E clock line 14 and counter chain input line 24, thereby resulting in a frequency input to counter chain 18 of E/4. Similarly, when transmission gate 32 is enabled, the frequency appearing on E clock line 14 is divided by divider stages 16A, 16B and 16C such that a frequency of E/8 is applied to counter chain input line 24. In like manner, enabling transmission gate 34 applies a frequency of E/16 to counter chain input line 24.

Counter chain 18 comprises a plurality of divider stages 18A, 18B, 18C, 18D, 18E, 18F, 18G, 18H, 18I, 18J, 18K, 18L, 18M, 18N, 18O and 18P which may comprise conventional flip flops. As can be seen, counter chain 18 supplies a fixed frequency divide function of $E/2^{16}$ although an output may be taken after certain of the various divider stages for input to postscaler 20. One output of counter chain 18 at the output of divider stage 18I is applied as an input to transmission gate 42 of postscaler 20. Similarly the outputs of divider stages 18J, 18K and 18M are applied respectively as inputs to transmission gates 40, 38 and 36 respectively. Enabling any of transmission gates 42, 40, 38 and 36, which together comprise a postscaler 20, couple a selected output of counter chain 18 to $E/2^{13}$ line 22. The output of counter chain 18 appearing at the output of divider stage 18P is used to provide a clocking signal to a timer overflow detection circuit based on the setting of prescaler 16 and the fixed divide function of counter chain 18. $E/2^{13}$ line 22 may be utilized in conjunction with a further programmable divider independent of control PR1 and PR0 for input to a real time interrupt circuit.

Figure 1B:
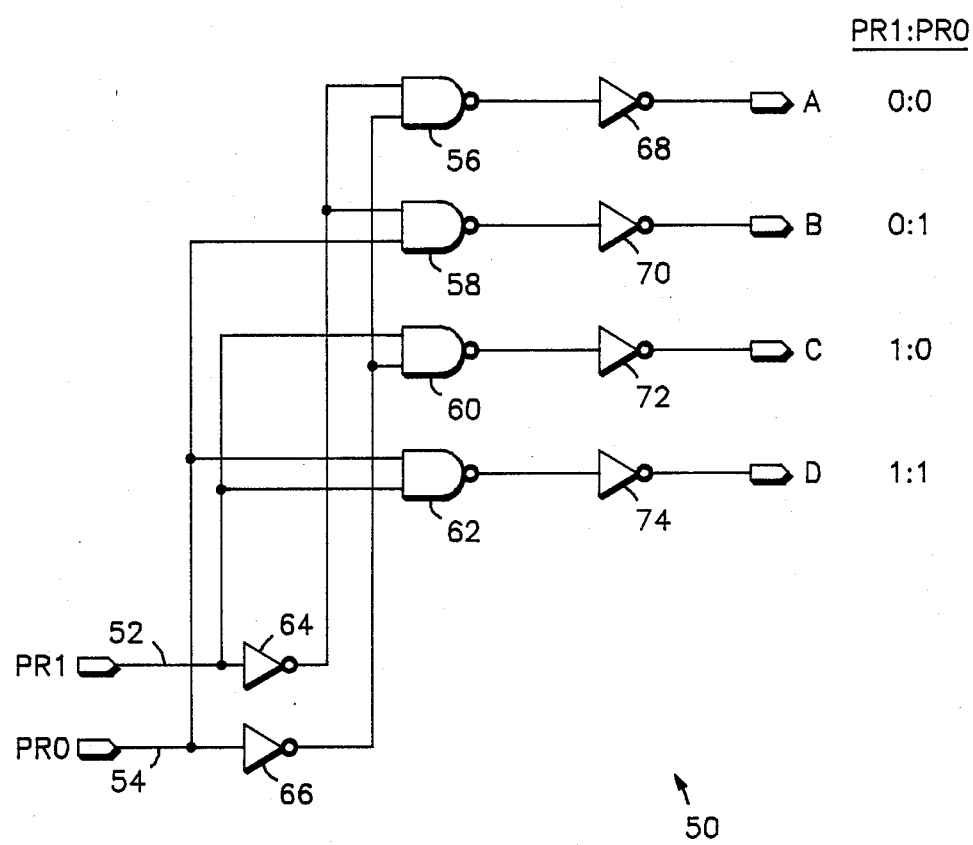
FIG. 1B is a simplified logic flow diagram of a system for selection of the programmable prescaler and corresponding postscaler functions of the present invention in response to control bits PR1 and PR0.

Referring additionally now to FIG. 1B, a control circuit 50 for use with timer 10 is shown. Control circuit 50 operates in response to two control bits, PR1 and PR0 appearing respectively on PR1 control bit line 52 and PR0 control bit line 54. PR1 control bit line 52 is applied as an input to inverter 64 and one input of NAND gates 60,62. PR0 control bit line 54 is supplied as input to inverter 66, one input to NAND gate 58 and the remaining input to NAND gate 62. The output of inverter 64 is connected to one input of NAND gate 56 and the remaining input of NAND gate 58. In like manner, the output of inverter 66 is applied to the remaining inputs of NAND gates 56,60.

Outputs from NAND gates 56, 58, 60 and 62 are applied respectively through inverters 68, 70, 72 and 74 for application to timer 10. In other applications it may be preferable to combine the function of NAND gates 56, 58, 60 and 62 with inverters 68, 70, 72 and 74 respectively by using AND gates. As illustrated, the output of inverter 68, corresponding to an input to control circuit 50 of PR1=0 and PR0=0 is applied to transmission gates 28 and 36. The output of inverter 70 corresponding to control bit inputs to control circuit 50 of PR1=0 and PR0=1 is applied to transmission gates 30,38. Likewise, the output of inverter 72 corresponding to control bit inputs to control circuit 50 of PR1=1 and PR0=0 is applied to transmission gates 32,40. Similarly, the output of inverter 74 corresponding to control bit inputs to control circuit 50 of PR1=1 and PR0=1 is applied to transmission gates 34,42.

In operation, it is desired that the output frequency appearing on $E/2^{13}$ line 22 be independent of the prescaled value set by prescaler 16. Thus, for each divisor inserted between E clock line 14 and counter chain input line 24, a correspondingly smaller divisor function is selected from counter chain 18 by postscaler 20 between a counter chain 18 output and $E/2^{13}$ line 22.

For example, should a logic 1 level appear on PR1 control bit line 52, and a logic 0 level appear on PR0 control bit line 54, a logic 1 level will appear at the output of inverter 72. This logic 1 level will be applied to transmission gates 32 and 40 of timer 10. In this manner, the clocking frequency appearing on E clock line 14 divided by divider stages 16A, 16B and 16C will be applied to counter chain input line 24. Thus, prescaler 16 will provide a divide function of $E/8$ or $E/2^3$. Counter chain 18, as shown, has a fixed frequency divide function of $E/2^{16}$, although outputs may be selected at $E/2^9$, $E^{10}$, $E^{11}$ or $E^{213}$. Thus, in this example, the frequency appearly as input to postscaler 20 at transmission gate 40 will be a frequency of $E/2^3$ times the counter chain 18 value of $E/2^{10}$ or $E/2^{13}$. In this manner, it can be seen that regardless of the prescale value selected for prescaler 16, a corresponding compensation function occurs with respect to postscaler 20 thus ensuring that the frequency on $E/2^{13}$ line 22 remains a constant.

What has been provided therefore is an improved sharable prescaled timer and method for a microprocessor which allows for utilization of a common free running counter chain by subsystems which must operate at a frequency independent of the prescaled frequency. By use of the timer and method of the present invention, a minimum amount of silicon area is necessary to provide a microprocessor's timing functions by reducing the logic required to implement combined functions.

While there have been described above the principles of the invention in conjunction with specific apparatus, it is to be clearly understood that this description is made only by way of example and not as a limitation to the scope of the invention.

We claim:

1. A programmable timer comprising first and second, variable length counter chains coupled in series between an input and an output, and control means responsive to a control signal for selectively varying the lengths of the first and second chains so that the length of the second chain is inversely related to the length of the first chain, whereby the total length of the first and second chains between the input and the output is constant.

2. The timer of claim 1 wherein the second chain provides a second output the frequency of which relative to the input of the first chain is determined only by the length of the first chain.

3. The timer of claim 2 further including a third counter chain of fixed length interposed between the first and second chains and in series therewith.

4. The timer of claim 3 further including a fourth counter chain coupled to the second output of the second chain.

5. The timer of claim 2 further including a third counter chain coupled to the second output of the second chain.

6. The timer of claim 1 further including a third counter chain of fixed length interposed between the first and second chains and in series therewith.

7. A method for operating a programmable timer comprising first and second, variable length counter chains coupled in series between an input and an output, the method comprising the step of selectively varying the lengths of the first and second chains so that the length of the second chain is inversely related to the length of the first chain, whereby the total length of the first and second chains between the input and the output is constant.

8. A programmable timer comprising:
prescaler means adapted to receive a clock signal having a predetermined frequency and a control signal, the prescaler means providing a prescaled clock signal having a frequency which, depending upon the state of the control signal, is a selected one of first and second submultiples of the frequency of the clock signal;
divider means for receiving the prescaled clock signal and providing a first output signal having a frequency which is greater than a third submultiple of the frequency of said clock signal by said first submultiple, a second output signal having a frequency which is greater than said third submultiple by said second submultiple, and a third output signal having a frequency which is a fourth submultiple of the frequency of the prescaled clock signal; and
descaler means for receiving the first and second output signals and the control signal, and for providing in response to said control signal the one of said first and second output signals having a frequency which is said third submultiple of the frequency of the clock signal.

9. The timer of claim 8 wherein the prescaler means are responsive to the control signal to provide a selected one of n prescaled clock signals each having a frequence which is a different submultiple of the frequency of the clock signal, wherein the divider means provide n output signals each having a frequency greater than said third submultiple by a respective one of said different submultiples, and wherein the descaler means are responsive to the control signal to provide the one of said n output signals having a frequency which is said third submultiple of the clock signal.

10. The timer of claim 9 wherein the prescaler means comprise a counter chain the length of which is selected by the control signal, wherein the divider means comprise a counter chain of fixed length which provides intermediate outputs from selected stages thereof, said wherein the descaler means comprise a switching network which provides a particular one of the intermediate outputs selected by the control signal.

11. The timer of claim 8 wherein the prescaler means comprise a counter chain the length of which is selected by the control signal, wherein the divider means comprise a counter chain of fixed length which provides intermediate outputs from selected stages thereof, and wherein the descaler means comprise a switching network which provides a particular one of the intermediate outputs selected by the control signal.

* * * * *